United States Patent
Chen et al.

(10) Patent No.: US 10,959,352 B1
(45) Date of Patent: Mar. 23, 2021

(54) COOLING SYSTEM WITH FLOATING COLD PLATE WITH SINGLE PIPES

(71) Applicant: Quanta Computer Inc., Taoyuan (TW)

(72) Inventors: Chao-Jung Chen, Taoyuan (TW); Yu-Nien Huang, Taoyuan (TW); Tsung-Ta Li, Taoyuan (TW); Chien-Hu Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/734,036

(22) Filed: Jan. 3, 2020

(51) Int. Cl.
*H05K 7/20* (2006.01)
*H01L 23/473* (2006.01)

(52) U.S. Cl.
CPC ....... *H05K 7/20772* (2013.01); *H01L 23/473* (2013.01); *H05K 7/20254* (2013.01); *H05K 7/20272* (2013.01); *H05K 7/20336* (2013.01); *H05K 7/20672* (2013.01); *H05K 7/20809* (2013.01)

(58) Field of Classification Search
CPC ........... H05K 7/20254; H05K 7/20272; H05K 7/20336; H05K 7/20509; H05K 7/20663; H05K 7/20672; H05K 7/20772; H05K 7/20809; H01L 23/427; H01L 23/473
See application file for complete search history.

(56) References Cited

U.S. PATENT DOCUMENTS

| | | | |
|---|---|---|---|
| 2004/0250992 A1* | 12/2004 | Aoki | H05K 7/20727 165/80.3 |
| 2006/0227504 A1* | 10/2006 | Chen | H05K 7/20927 361/679.47 |
| 2008/0164010 A1* | 7/2008 | Kang | F28D 15/046 165/104.26 |
| 2008/0218963 A1* | 9/2008 | Wu | H01L 23/427 361/679.48 |
| 2013/0104592 A1* | 5/2013 | Cottet | F28D 15/0266 62/419 |
| 2016/0334842 A1* | 11/2016 | Liao | H05K 7/20409 |
| 2019/0239386 A1* | 8/2019 | Chen | H05K 7/20772 |
| 2019/0254196 A1* | 8/2019 | Ma | H05K 7/2039 |
| 2019/0343021 A1* | 11/2019 | Zhang | F28D 15/04 |
| 2020/0196483 A1* | 6/2020 | Lan | H05K 7/20772 |

* cited by examiner

*Primary Examiner* — Jacob R Crum
(74) *Attorney, Agent, or Firm* — Nixon Peabody LLP (57) ABSTRACT

A cooling unit having two single piece cold plate pipe components is disclosed. The cooling unit has a first pipe operable to transport coolant. A first cold plate has a top surface with a lateral groove to accept a section of the first pipe. The groove includes a first inlet coupled to a first hole in the section of the first pipe. The groove has a first outlet coupled to a second hole in the section of the first pipe. Coolant is circulated from the first inlet through the cold plate to the first outlet. The section of the first pipe is connected to the first cold plate. A second pipe is operable to transport coolant. A second cold plate is located next to the first cold plate. The second cold plate has a groove to accept a section of the second pipe. The groove includes an inlet coupled to a first hole in the section of the second pipe. The groove includes an outlet coupled to a second hole in the section of the second pipe. The coolant is circulated from the second inlet through the second cold plate to the second outlet. The section of the second pipe is connected to the second cold plate.

18 Claims, 7 Drawing Sheets

COOLING SYSTEM WITH FLOATING COLD PLATE WITH SINGLE PIPES

TECHNICAL FIELD

The present disclosure relates generally a cooling system for a computer system. More particularly, aspects of this disclosure relate to a cooling system with a series of floating cold plates connected to a single pipe.

BACKGROUND

Electronic devices, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, current servers are designed to rely on air flow through the interior of the device to carry away heat generated from electronic components. Servers often include various heat sinks that are attached to the electronic components such as processing units. Heat sinks absorb the heat from the electronic components, thus transferring the heat away from the components. The heat from heat sinks must be vented away from the server. Air flow to vent away such heat is often generated by a fan system.

Due to the improvement of high-performance systems, the amount of heat that needs to be removed becomes higher with each new generation. With the advent of even more powerful components, traditional air cooling in combination with fan systems are inadequate to sufficiently remove heat generated by new generation servers. The development of liquid cooling has been spurred by the need for increased cooling. Liquid cooling is the best solution for rapid heat removal due to the superior thermal performance from liquid cooling. At room temperature, the heat transfer coefficient of air is only 0.024 W/mK while a coolant, such as water, has a heat transfer coefficient of 0.58 W/mK, which is 24 times than that of air. It is more effective in transporting heat away from a heat source to a radiator, and allows heat removal from critical parts without noise pollution. Typically, a liquid cooling system will include a cold plate, which is a block that forms a network of internal channels for liquid coolant flow. The cold plate will include an inlet and an outlet that allows coolant from a pipe to fluidly access the internal channels. The inlet and outlet are attached to pipes that supply coolant to the inlet and funnel coolant from the outlet. The cold plate is installed in contact with the electronic component, and the liquid coolant circulating through the pipes transfers generated heat away from the component.

However, liquid cooling systems present unique challenges. For example, one of the most feared problems of liquid cooling solutions is coolant leakage. Leaks are often caused by the joints between the various pipes that are necessary to circulate the coolant to the components that require cooling. Leaking from liquid cooling systems may cause short circuits and impede the operation of servers and other systems.

Figure 1:
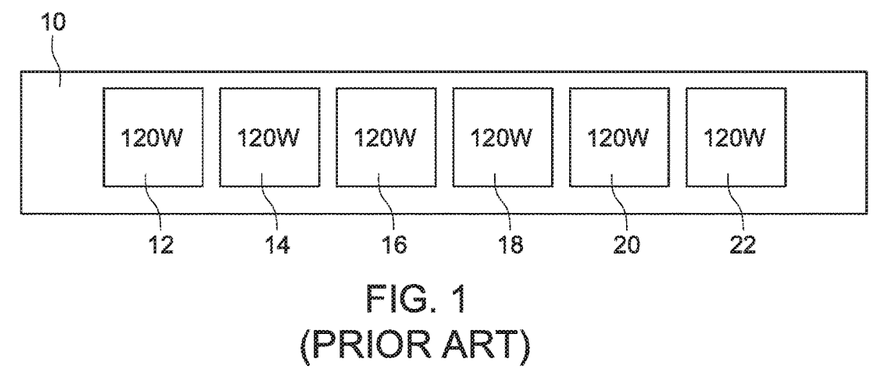
FIG. 1 is a set of electronic components densely arranged on a typical prior art board that require cooling.

Such liquid cooling system problems are compounded by the dense packaging of components on modern server systems. For example, as shown in FIG. 1, a known circuit board 10 has electronic components, such as processor chips 12, 14, 16, 18, 20, and 22, arranged in a row. In this example, such components may require large amounts of power (e.g., 120 W from each component) and therefore generate large amounts of heat. Such a large number of high power components 12, 14, 16, 18, 20, and 22 in a row have very small gaps between the components 12, 14, 16, 18, 20, and 22. The small gaps between the components do not provide enough space to place a pipe connector, such as that required by a traditional cold plates, between the components 12, 14, 16, 18, 20, and 22. It is not feasible to use a large cold plate instead of individual cold plates to cover all of the components 12, 14, 16, 18, 20, and 22, because the poor contact caused by the gaps between components and a large plate created by component and plate tolerances.

Thus, there is a need for a liquid cooling design that uses floating cold plates to create contact sufficient for cooling of components. There is also a need for a liquid cooling design that allows adequate cooling of densely arrangement components. There is a further need for a one piece pipe and cold plate to prevent the leaking of coolant.

SUMMARY

One disclosed example is a cooling unit that has a first pipe operable to transport coolant. A first cold plate has a top surface with a lateral groove to accept a section of the first pipe. The groove includes a first inlet coupled to a first hole in the section of the first pipe. The groove has a first outlet coupled to a second hole in the section of the first pipe. Coolant is circulated from the first inlet through the cold plate to the first outlet. The section of the first pipe is connected to the first cold plate. A second pipe is operable to transport coolant. A second cold plate is located next to the first cold plate. The second cold plate has a groove to accept a section of the second pipe. The groove includes a second inlet coupled to a first hole in the section of the second pipe. The groove includes a second outlet coupled to a second hole in the section of the second pipe. The coolant is circulated from the second inlet through the second cold plate to the second outlet. The section of the second pipe is connected to the second cold plate.

Another disclosed example is a cooling system for cooling an electronic component. The cooling system includes a first pipe operable to transport coolant. A first cold plate has a top surface with a lateral groove to accept a section of the first pipe. The groove includes a first inlet coupled to a first hole in the section of the first pipe. The groove has a first outlet coupled to a second hole in the section of the first pipe. Coolant is circulated from the first inlet through the cold plate to the first outlet. The section of the first pipe is connected to the first cold plate. A second pipe is operable to transport coolant. A second cold plate is located next to the first cold plate. The second cold plate has a groove to accept a section of the second pipe. The groove includes a second inlet coupled to a first hole in the section of the second pipe. The groove includes a second outlet coupled to a second hole in the section of the second pipe. The coolant is circulated from the second inlet through the second cold plate to the second outlet. The section of the second pipe is connected to the second cold plate. A pump circulates coolant to the first and second pipes. A radiator accepts coolant from the first and second pipes.

Another disclosed example is a computer system with a circuit board having a first and a second electronic component arranged next to each other. The system includes a first pipe operable to transport coolant. A first cold plate is attached to the first electronic component. The first cold plate has a top surface with a lateral groove to accept a section of the first pipe. The groove includes a first inlet coupled to a first hole in the section of the first pipe. The groove has a first outlet coupled to a second hole in the section of the first pipe. Coolant is circulated from the first inlet through the cold plate to the first outlet. The section of the first pipe is connected to the first cold plate. A second pipe is operable to transport coolant. A second cold plate is located next to the first cold plate. The second cold plate is connected to the second electronic component. The second cold plate has a groove to accept a section of the second pipe. The groove includes a second inlet coupled to a first hole in the section of the second pipe. The groove includes a second outlet coupled to a second hole in the section of the second pipe. The coolant is circulated from the second inlet through the second cold plate to the second outlet.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to a cooling system where the cold plate and water pipe are assembled into a single piece to prevent leakage of coolant. The design that includes floating cold plates, allows the contact force average between cold plate and chipsets. Thus, each component has an individual cooling plate.

Figure 2:
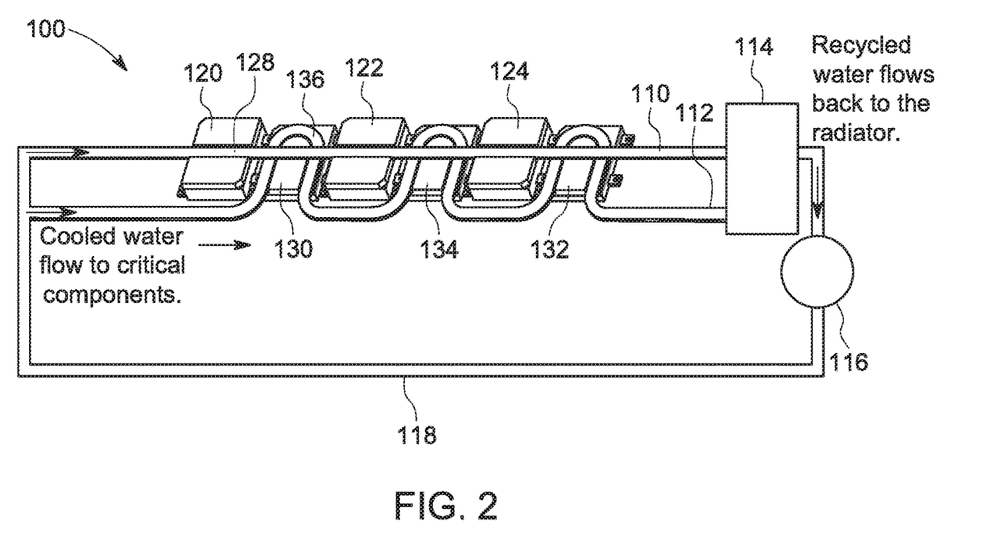
FIG. 2 is a perspective view of the example liquid cooling system using floating cold plates to cool components.

FIG. 2 shows a cooling system 100 that incorporates single pipes and floating cold plates to prevent leaks and provide better contact with the components to be cooled. The cooling system 100 includes two coolant pipes 110 and 112, a radiator 114, a pump 116, and a return pipe 118. The pump 116 circulates coolant through the coolant pipes 110 and 112 to supply coolant to cold plates to carry heat away from components such as processor chips. The heated coolant flows through the radiator 114 to cool the coolant, and the cooled coolant is pumped through the return pipe 118 via the pump 116.

The coolant pipe 110 is attached to floating cold plates 120, 122, and 124. The coolant pipe 110 supplies coolant to each of the cold plates 120, 122, and 124. As will be explained below, each of the cold plates 120, 122, and 124 include internal channels that circulate the coolant to transfer heat generated from the electrical component. The coolant is then circulated back to the pipe 110. The coolant pipe 110 is generally straight and includes segments inserted in cold plates, such as a section 128, that is flush with one of the cold plates such as the cold plate 120. The section 128 is brazed onto the cold plate 120.

Similarly, the coolant pipe 112 is attached to floating cold plates 130, 132, and 134. The coolant pipe 112 supplies coolant to each of the cold plates 130, 132, and 134. The coolant pipe 112 includes a series of bend sections that supply coolant to the cold plates 130, 132, and 134. The coolant pipe 112 thus has several bend sections, such as a bend section 136, that is attached to the top of the cold plate 130. The bend section 136 is brazed onto the cold plate 130. Each of the cold plates 130, 132, and 134 may be placed in contact with an electrical component such as a processor chip. As will be explained below, each of the cold plates 130, 132, and 134 include internal channels that circulate coolant to transfer heat generated from the electrical component. The coolant is then circulated back to the pipe 112.

In this example, the cold plates 120, 122, 124, 130, 132, and 134 are copper, but any thermally conductive material may be used. The coolant pipes 110 and 112 are fabricated from SUS304 stainless steel in this example. As may be seen in FIG. 2, the footprint space of the coolant system 100 is very compact because the coolant pipes 110 and 112 are flush with the cold plates 120, 122, 124, 130, 132, and 134. The coolant pipe 110 runs over the cold plates 120, 122, and 124, while the coolant pipe 112 is flush against the sides of the cold plates 120, 122, 124, 130, 132, and 134. In this manner, six densely spaced chips such as the components shown in FIG. 1 may be cooled by the respective cold plates 120, 122, 124, 130, 132, and 134 arranged as shown in FIG. 2. In conjunction with the circuit board 10 in FIG. 1, the cold plates 120, 122, 124 may be placed in contact with the components 12, 16, and 20 respectively, while the cold plates 130, 132, and 134 are placed in contact with the components 14, 18, and 22, respectively. Although six chips are cooled by the system 100, fewer or more chips may be cooled by increasing or decreasing the number of cold plates connected to the pipes 110 and 112.

Figure 3:
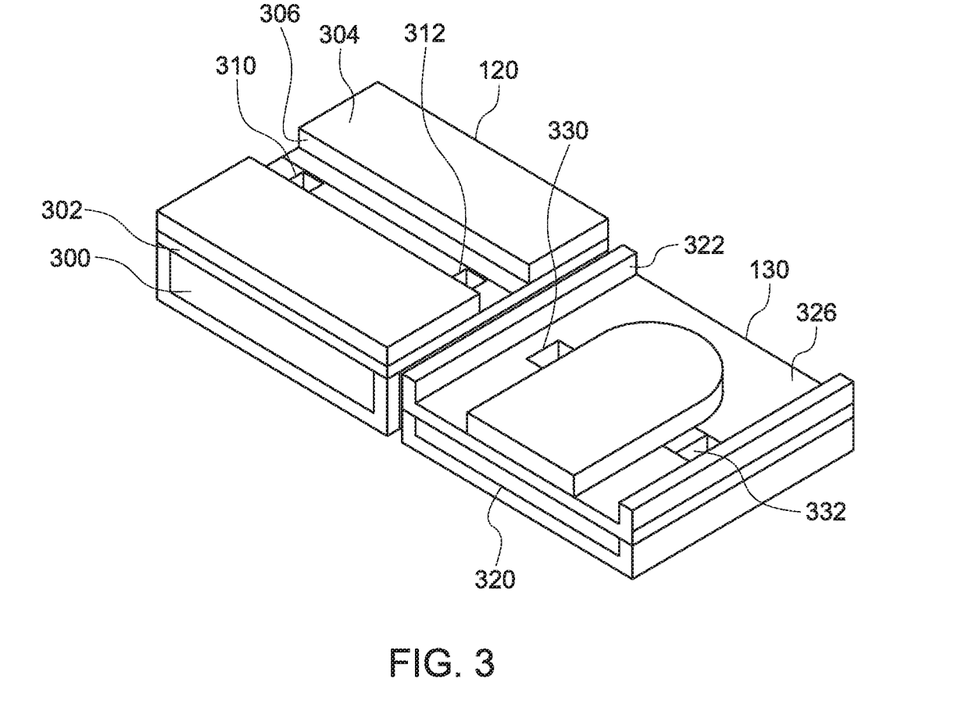
FIG. 3 is a perspective view of the two types of cold plates in the system in FIG. 2.

FIG. 3 is a perspective view of the cold plate 120 and the cold plate 130. The cold plate 120 includes a roughly square shaped base support 300. The support 300 has a cover member 302 that includes a top surface 304 that has a lateral groove 306. The section 128 of the pipe 110 is mounted in the lateral groove 306 as shown in FIG. 2. One end of the lateral groove 306 includes an inlet flow hole 310. The opposite end of the lateral groove 306 includes an outlet flow hole 312. As will be explained, the coolant flows through the inlet flow hole 310 to the cold plate 120. Coolant that transfers heat emitted by the electronic component is returned to the pipe section 128 via the outlet flow hole 312.

The cold plate 130 includes a roughly square shaped base support 320. The support 320 includes a cover member 322 with a top surface 324. A U-shaped groove 326 is formed on the top surface 324. The bend section 136 of the pipe 112 is mounted in the groove 326 as shown in FIG. 2. One end of the U-shaped groove 326 includes an inlet flow hole 330. The opposite end of the U-shaped groove 326 includes an outlet flow hole 332. As will be explained, the coolant flows through the inlet flow hole 330 to the cold plate 130. Coolant that transfers heat emitted by the electronic component is returned to the bend section 136 via the outlet flow hole 332.

Figure 4A:
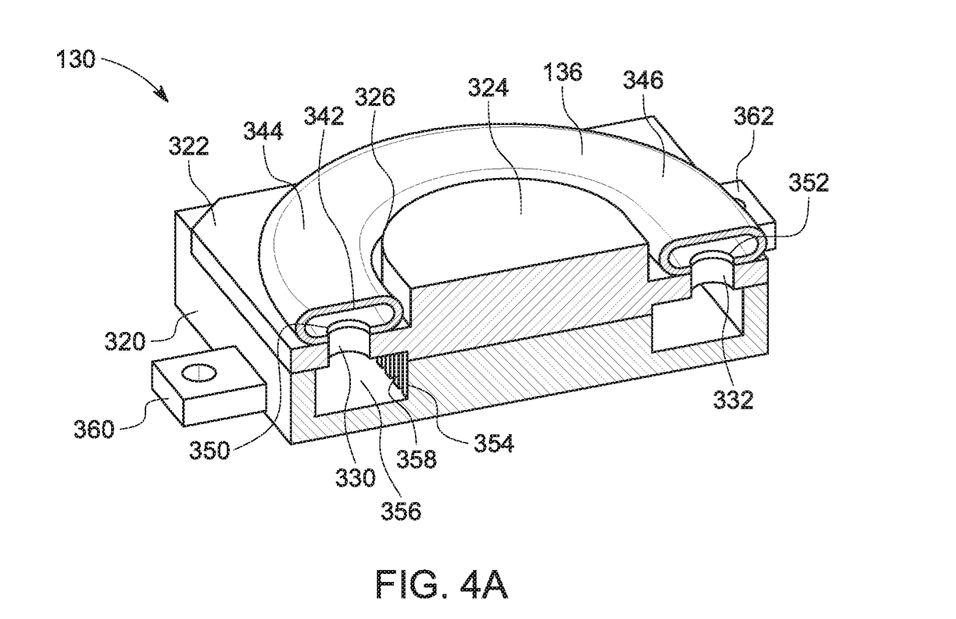
FIG. 4A is a perspective cutaway view of one of the cold plates in the system in FIG. 2.
Figure 4B:
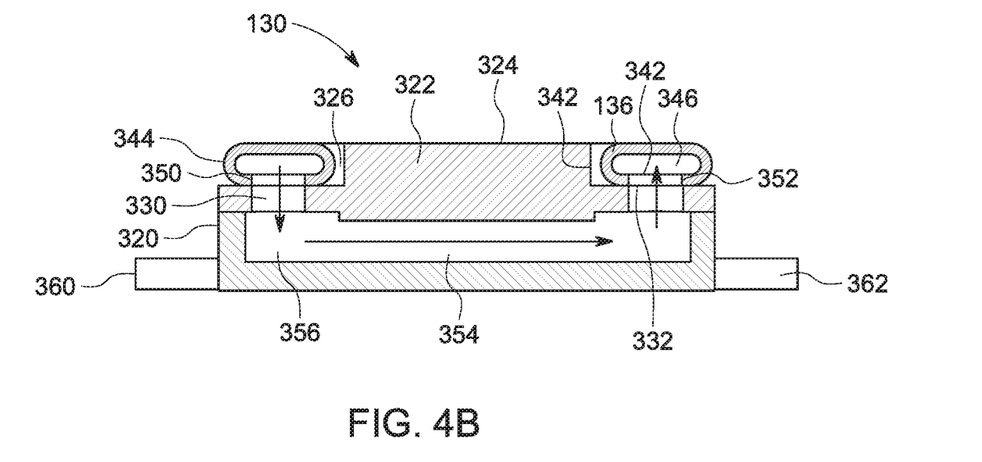
FIG. 4B is a cross section of one of the cold plates in the system in FIG. 2.
Figure 4C:
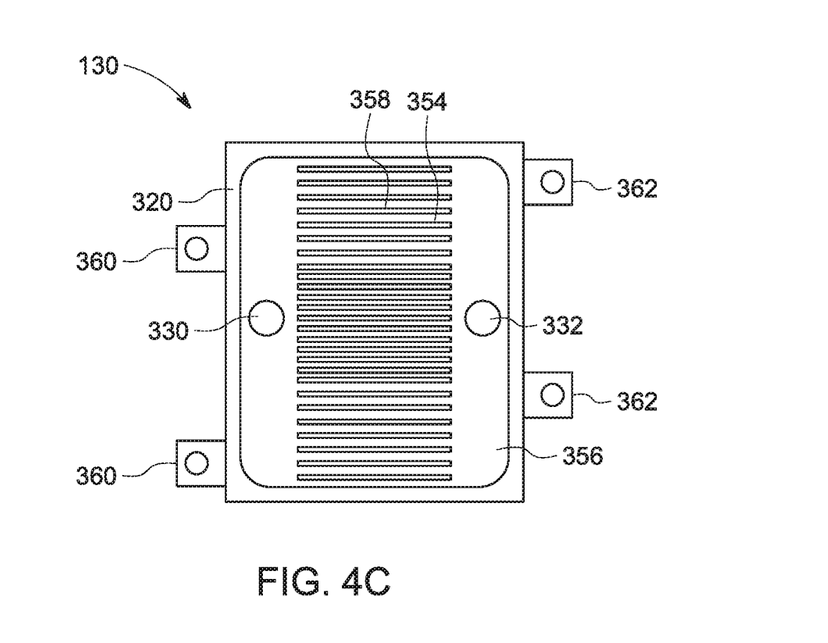
FIG. 4C is a top cutaway of one of the cold plates in the system in FIG. 2.

FIG. 4A is a cutaway perspective view of the cold plate 130 in FIG. 2. FIG. 4B is a cutaway side view of the cold plate 130 in FIG. 2. FIG. 4C is a top view of the internal channels in the cold plate 130 in FIG. 2. The bend section 136 has a flow cross section 342; and a first arm 344 and a second parallel arm 346. The bend section 136 has an outlet flow hole 350 on one end of the arm 344, and an inlet flow hole 352 on one end of the arm 346. As will be explained, the coolant flows through the outlet flow hole 350 to the cold plate 130. Coolant that carries heat emitted by the electronic component is returned to the pipe section 136 via the inlet flow hole 352. The base support 320 includes interior internal channels 354 that allow coolant flow internally in the support 320. The internal channels 354 are in a hollow space 356 formed in the interior of the support 320. A series of internal fins 358 separate the hollow space 356 to create the internal channels 354. The internal channels 354 guide coolant flow over the area of the base support 320 to transfer heat transferred to the base support 320 from the component. As shown in FIGS. 4A-4B, the outlet flow hole 350 of the bend section 136 is aligned with the inlet hole 330 in the groove 326 to fluidly communicate coolant to the internal channels 354. The inlet flow hole 352 of the bend section 136 is aligned with the outlet hole 332 to collect coolant from the internal channels 354 back to the bend section 136.

The base support 320 includes side tabs 360 and 362 that allow the base support 320 to be attached to an electronic component. The base support 320 is attached to the electronic component to create thermal contact between the base support 320 in FIG. 3 and the component. In this example, the pipe segment 136 is brazed to the groove 314 of the base support 320. Brazing is a processing technique used for the welding of automotive parts and mechanical hardware parts. Using the brazing technology, the strength of the two work pieces is increased, the airtightness between the two pieces is better, the technology is compatible with profiled material. Thus, the cold plate 130 and the coolant pipe 112 (both shown in FIG. 2) are produced as one piece by brazing them together. This arrangement prevents leaking of coolant between the pipe 112 and the cold plate 130.

Figure 4D:
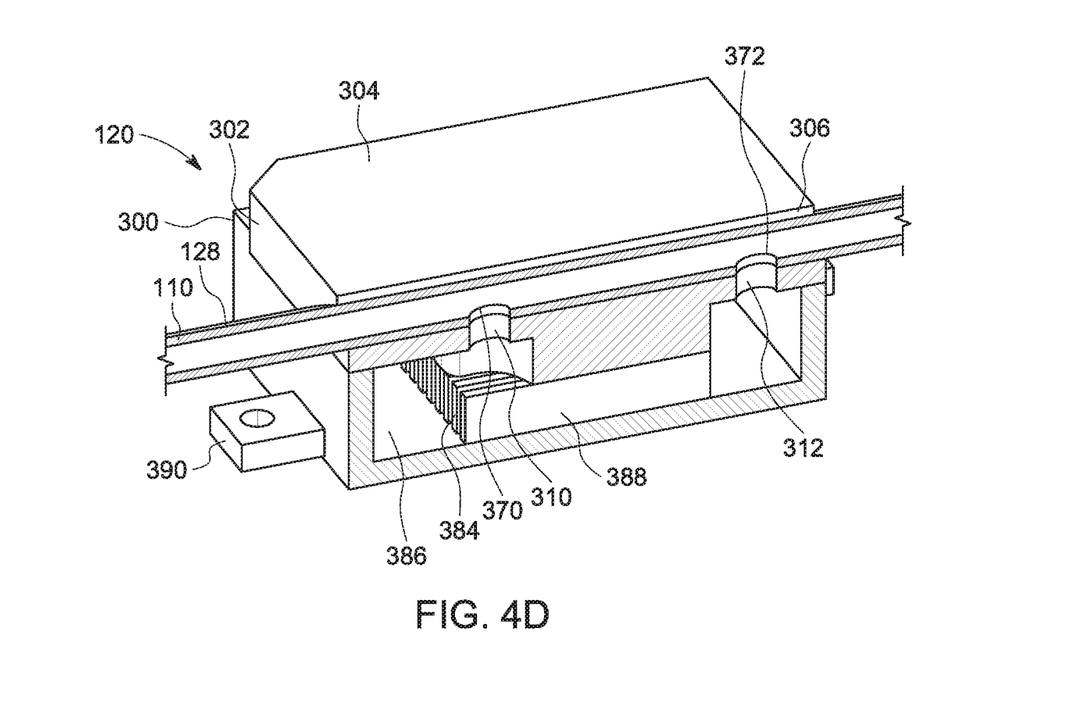
FIG. 4D is a perspective view of another one of the cold plates in the system in FIG. 2.
Figure 4E:
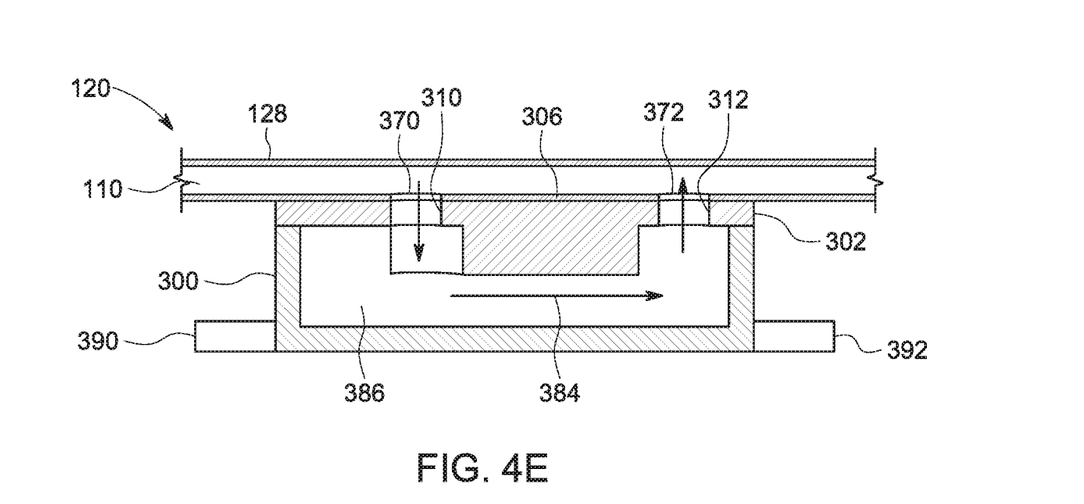
FIG. 4E is a cutaway side view of the cold plate shown in FIG. 4D.

FIG. 4D is a cutaway perspective view of the cold plate 120 in FIG. 2. FIG. 4E is a cutaway side view of the cold plate 120 in FIG. 2. The section 128 has an outlet flow hole 370 on one end and an inlet flow hole 372 on the other end. As will be explained, the coolant flows through the outlet flow hole 370 to the cold plate 120. Coolant that carries heat emitted by the electronic component is returned to the pipe section 128 via the inlet flow hole 372. Similar to the interior of the plate 130 shown in FIG. 4C, the base support 300 includes interior internal channels 384 that allow coolant flow internally in the support 300. The internal channels 384 are in a hollow space 386 formed in the interior of the support 300. A series of internal fins 388 separate the hollow space 386 to create the internal channels 384. The internal channels 384 guide coolant flow over the area of the base support 300 to transfer heat transferred to the base support 300 from the component. As shown in FIGS. 4D-4E, the outlet flow hole 370 of the section 128 is aligned with the inlet hole 310 in the groove 306 to fluidly communicate coolant to the internal channels 384. The inlet flow hole 372 of the pipe section 128 is aligned with the outlet hole 312 to collect coolant from the internal channels 384 back to the pipe section 128.

The base support 300 includes side tabs 390 and 392 that allow the base support 320 to be attached to an electronic component. The base support 300 is attached to the electronic component to create thermal contact between the base support 300 in FIG. 3 and the component. In this example, the pipe segment 128 is brazed to the groove 306 of the base support 300. In this example, the cold plate 120 and the coolant pipe 110 (both shown in FIG. 2) are produced as one piece by brazing them together. This arrangement prevents leaking of coolant between the pipe 110 and the cold plate 120.

Figure 5A:
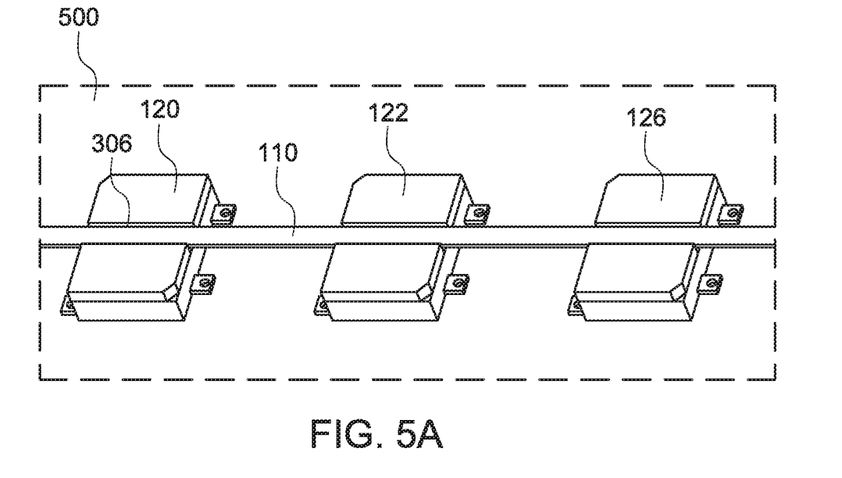
FIG. 5A is a perspective view of one of the pipes in relation to the cold plates in FIG. 1.

As explained above, the water pipe 110 in FIG. 2 provides coolant to the cold plates 120, 122, and 124. FIG. 5A shows a single component 500 that is formed when the water pipe 110 is placed in the grooves of the cold plates 120, 122, and 124 such as the groove 306 shown in FIG. 3. The pipe sections that fit in the grooves are attached to the respective cold plates 120, 122, and 124 by brazing to form the single component 500.

Figure 5B:
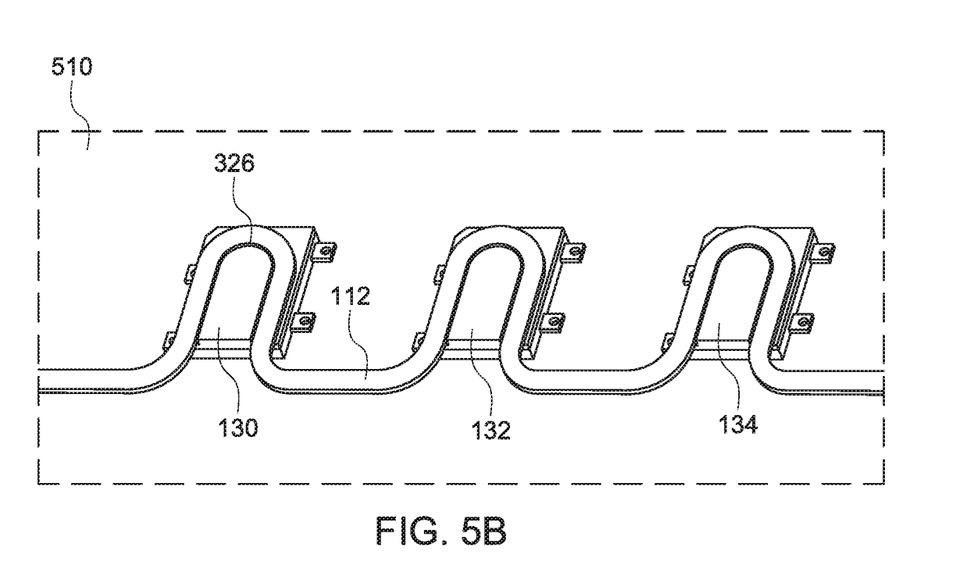
FIG. 5B is a perspective view of the other coolant pipe in relation to the cold plates in FIG. 1.

The coolant pipe 112 in FIG. 2 separately provides coolant to the cold plates 130, 132, and 134. FIG. 5B shows a single component 510 that is formed when the bend sections in the coolant pipe 112, such as the bend section 136 in FIG. 2, are placed in the grooves of the cold plates 130, 132, and 134 such as the U-shaped groove 326 shown in FIG. 3. The pipe sections that fit in the grooves are attached to the cold plates 130, 132, and 134 to form the single component 510.

Figure 6A:
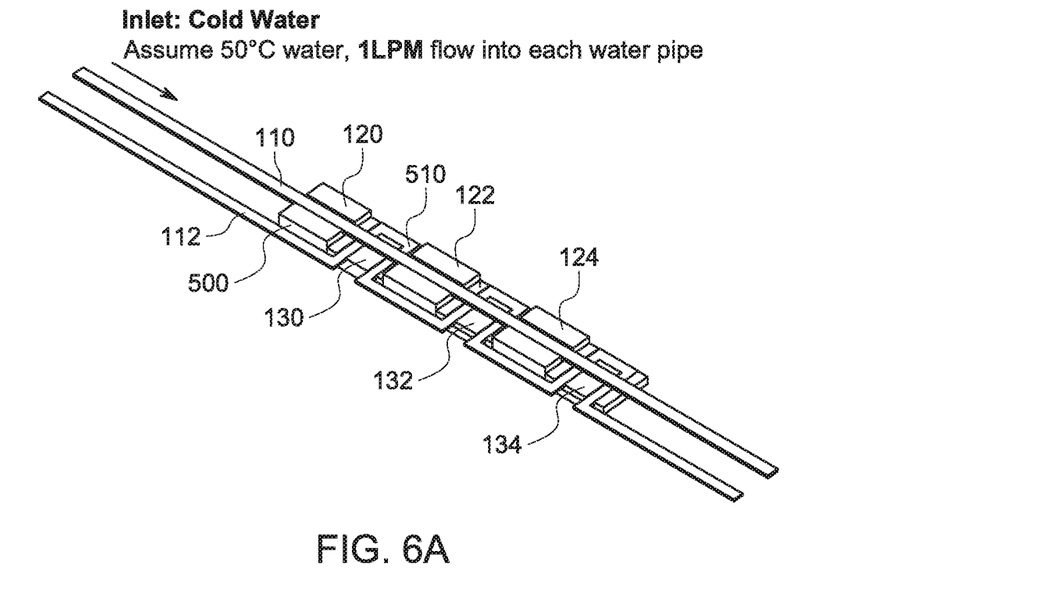
FIG. 6A is a perspective view of the water flow through the cold plates in the system in FIG. 1.
Figure 6B:
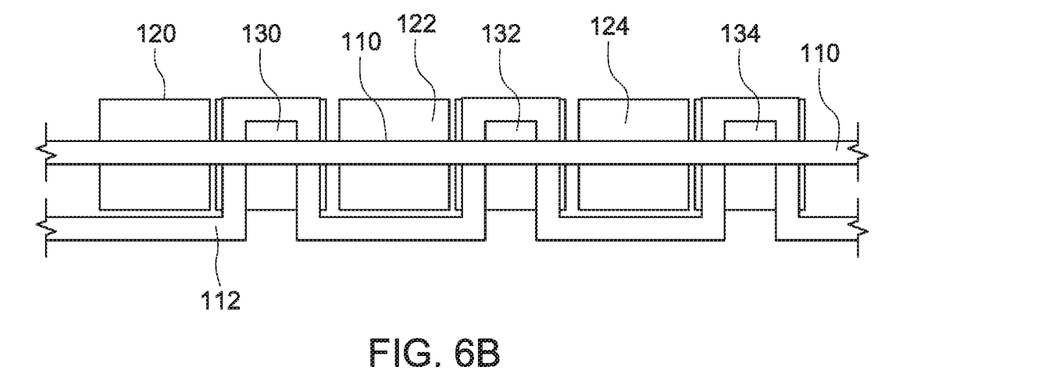
FIG. 6B is a top view of the pipes and cold plates in the system in FIG. 1.
Figure 6C:
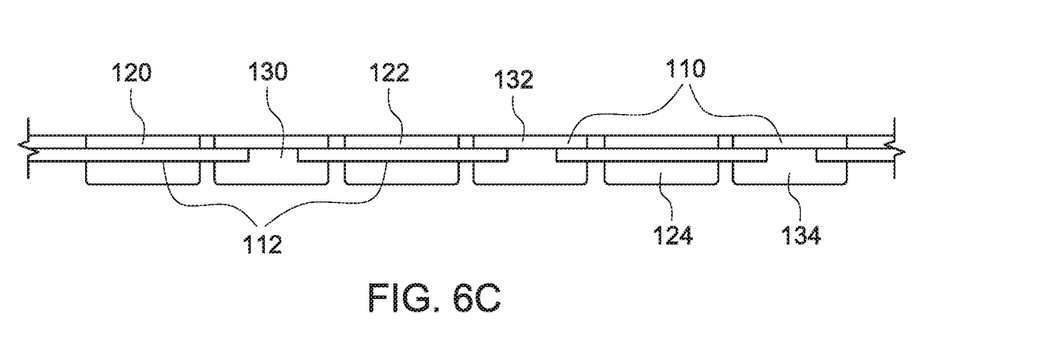
FIG. 6C is a side view of the pipes and cold plates in the system in FIG. 1.

FIG. 6A is a perspective view of the assembly of the two components 500 and 510 in FIGS. 5A-5B. FIG. 6B is a top view of the assembly of the two components 500 and 510 in FIGS. 5A-5B. FIG. 6C is a side view of the assembly of the two components 500 and 510 in FIGS. 5A-5B. As may be seen, the cold plates 120, 122, and 124 are arranged between the cold plates 130, 132, and 134. The coolant is supplied to components 500 and 510 via respective coolant pipes 110 and 112. The cold plates 120, 122, and 124 have a greater height so the supported pipe 110 may pass over the plates 130, 132, and 134. The U-shaped grooves in the plates 130, 132, and 134 allow the supported coolant pipe 112 to be flush with the height of the plates 130, 132, and 134.

The design arranges the cold plates 120, 122, 124, 130, 132, and 134 in an interlocking pattern. This alternates the different heights of the plates 120, 122 and 124 relative to the plates 130, 132 and 134 in order to give the cold plates 120 and 130 better contact with individual components in comparison to a single cold plate covering all of the components. Further, since the plates 120, 122, 124, 130, 132, and 134 are spaced from each other, the occurrence of warpage in the pipes 110 and 112 is minimized by maximizing elasticity. Thus, the contact force is better averaged between the cold plates 120, 122, 124, 130, 132, and 134 and the respective chipsets. The configuration makes the heat transfer from the components to the cold plates 120, 122, 124, 130, 132, and 134 better because one cold plate may be allocated to each component, thus providing superior heat transfer to the cold plate allocated to the component.

The example cooling system in FIG. 2 may be installed to cool a configuration such as that in FIG. 1 that has six chips in a row. The effectiveness of the cooling system 100 in FIG. 2 was evaluated based on each of the six components cooled by the system 100 emitting 120 W of evidence. In this example, the case temperature specification for the chips is 93° C. and a simulation model was constructed. The water that serves as the coolant circulated in the pipes 110 and 112 is cooled to 50° C. from the radiator 114. The pump drives the return flow of the water into each coolant pipe 110 and 112 at 1 liter per minute in this example.

Figure 7:
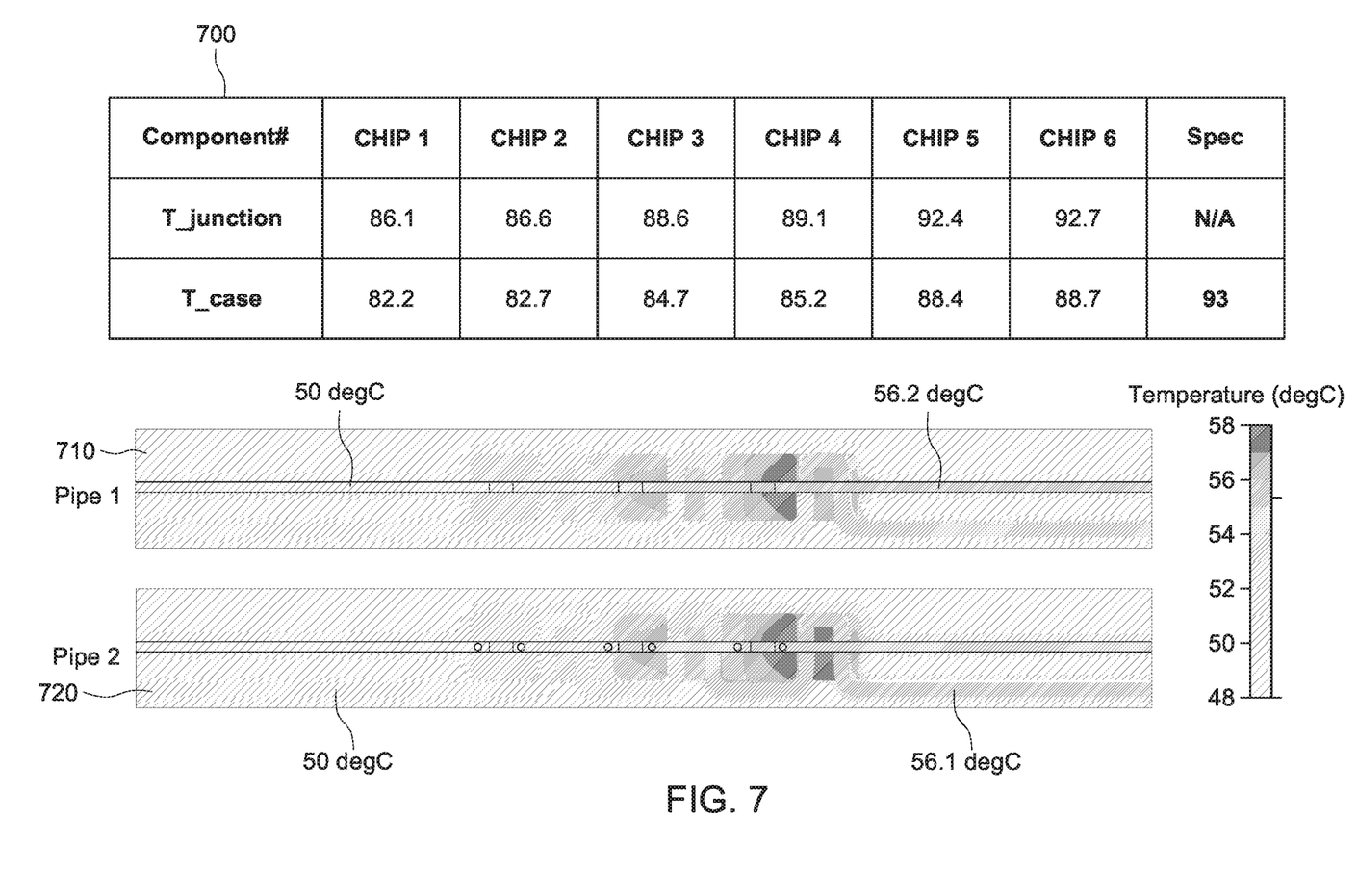
FIG. 7 is a chart of temperatures and heat maps of the example pipes in the system in FIG. 1.

FIG. 7 shows a chart 700 that shows the measured water temperatures under the above parameters. The chart 700 shows the temperatures measured at each junction temperature of the example semiconductor components in the chip and the chip case itself. FIG. 7 also shows a heat map 710 of the pipe 110 and the cold plates 120, 122, and 124 in FIG. 2. FIG. 7 also shows a heat map 720 of the pipe 112 and the cold plates 130, 132, and 124 in FIG. 2. As may be seen in the heat maps 710 and 720, the simulation shows that the system 100 can meet the cooling requirements of the specification of the chips.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A cooling unit for cooling an electronic component, comprising:
   a first pipe operable to transport coolant;
   a first cold plate having a top surface with a lateral groove to accept a section of the first pipe, the lateral groove of the first cold plate including a first inlet coupled to a first hole in the section of the first pipe and a first outlet coupled to a second hole in the section of the first pipe, wherein the coolant is circulated from the first inlet through the cold plate to the first outlet, and wherein the section of the first pipe is connected to the first cold plate;
   a second pipe operable to transport coolant; and
   a second cold plate located next to the first cold plate, the second cold plate having a groove to accept a section of the second pipe, the groove of the second plate including a second inlet coupled to a first hole in the section of the second pipe and a second outlet coupled to another hole in the section of the second pipe, wherein the coolant is circulated from the second inlet through the second cold plate to the second outlet, and wherein the section of the second pipe is connected to the second cold plate.

2. The cooling unit of claim 1, wherein the section of the second pipe is U-shaped, and wherein the groove of the second cold plate has a corresponding U-shape.

3. The cooling unit of claim 1, wherein the cold plates are copper.

4. The cooling unit of claim 1, wherein the first and second pipes are stainless steel.

5. The cooling unit of claim 1, wherein the section of the first pipe and the first cold plate are connected together by brazing, and wherein the section of the second pipe and the second cold plate are connected together by brazing.

6. The cooling unit of claim 1, wherein the first and second cold plates include internal vanes to direct the coolant.

7. The cooling unit of claim 1, wherein the first pipe is routed over the second cold plate, and wherein the second pipe is routed on a side of the first cold plate.

8. The cooling unit of claim 1, further comprising:
a third cold plate having a top surface with a lateral groove to accept a second section of the first pipe, the lateral groove of the third cold plate including a third inlet coupled to a second hole in the second section of the first pipe and a third outlet coupled to a first hole in the second section of the first pipe, wherein the coolant is circulated from the third inlet through the third cold plate to the third outlet, and wherein the second section of the first pipe is connected to the third cold plate; and
a fourth cold plate located next to the third cold plate, the fourth cold plate having a groove to accept a second section of the second pipe, the groove of the fourth cold plate including a fourth inlet coupled to a first hole in the second section of the second pipe and a fourth outlet coupled a second hole in the second section of the second pipe, wherein the coolant is circulated from the fourth inlet through the fourth cold plate to the fourth outlet.

9. A cooling system for cooling an electronic component, the cooling system comprising:
a first pipe operable to transport coolant;
a first cold plate having a top surface with a lateral groove to accept a section of the first pipe, the lateral groove of the first cold plate including a first inlet coupled to a first hole in the section of the first pipe and a first outlet coupled to a second hole in the section of the first pipe, wherein the coolant is circulated from the first inlet through the cold plate to the first outlet, and wherein the section of the first pipe is connected to the first cold plate;
a second pipe operable to transport coolant;
a second cold plate located next to the first cold plate, the second cold plate having a groove to accept a section of the second pipe, the groove of the second plate including a second inlet coupled to a first hole in the section of the second pipe and a second outlet coupled to another hole in the section of the second pipe, wherein the coolant is circulated from the second inlet through the second cold plate to the second outlet, and wherein the section of the second pipe is connected to the second cold plate;
a pump operable to circulate coolant to the first and second pipes; and
a radiator to accept coolant from the first and second pipes.

10. The cooling system of claim 9, wherein the section of the second pipe is U-shaped, and wherein the groove of the second cold plate has a corresponding U-shape.

11. The cooling system of claim 9, wherein the cold plates are copper.

12. The cooling system of claim 9, wherein the first and second pipes are stainless steel.

13. The cooling system of claim 9, wherein the section of the first pipe and the first cold plate are connected together by brazing, and wherein the section of the second pipe and the second cold plate are connected together by brazing.

14. The cooling system of claim 9, wherein the first and second cold plates include internal vanes to direct the coolant.

15. The cooling system of claim 9, wherein the first pipe is routed over the second cold plate, and wherein the second pipe is routed on a side of the first cold plate.

16. The cooling system of claim 9, further comprising:
a third cold plate having a top surface with a lateral groove to accept a second section of the first pipe, the lateral groove of the third cold plate including a third inlet coupled to a second hole in the second section of the first pipe and a third outlet coupled to a first hole in the second section of the first pipe, wherein the coolant is circulated from the third inlet through the third cold plate to the third outlet, and wherein the second section of the first pipe is connected to the third cold plate; and
a fourth cold plate located next to the third cold plate, the fourth cold plate having a groove to accept a second section of the second pipe, the groove of the fourth cold plate including a fourth inlet coupled to a first hole in the second section of the second pipe and a fourth outlet coupled a second hole in the second section of the second pipe, wherein the coolant is circulated from the fourth inlet through the fourth cold plate to the fourth outlet.

17. A computer system comprising:
a circuit board having a first and a second electronic component arranged next to each other;
a first pipe operable to transport coolant;
a first cold plate attached to the first electronic component, the first cold plate having a top surface with a lateral groove to accept a section of the first pipe, the lateral groove of the first cold plate including a first inlet coupled to a first hole in the section of the first pipe and a first outlet coupled to a second hole in the section of the first pipe, wherein the coolant is circulated from the first inlet through the cold plate to the first outlet, and wherein the section of the first pipe is connected to the first cold plate;
a second pipe operable to transport coolant; and
a second cold plate located next to the first cold plate, the second cold plate connected to the second electronic component, the second cold plate having a groove to accept a section of the second pipe, the groove of the second plate including a second inlet coupled to a first hole in the section of the second pipe and a second outlet coupled to another hole in the section of the second pipe, wherein the coolant is circulated from the second inlet through the second cold plate to the second outlet, and wherein the section of the second pipe is connected to the second cold plate.

18. The computer system of claim 17, wherein the first and second electronic components are processor chips.

* * * * *